United States Patent
Fukuda et al.

(10) Patent No.: US 9,929,321 B2
(45) Date of Patent: Mar. 27, 2018

(54) PHOSPHOR, PRODUCING METHOD THEREOF AND LIGHT-EMITTING DEVICE EMPLOYING THE PHOSPHOR

(71) Applicant: KABUSHIKI KAISHA TOSHIBA, Minato-ku (JP)

(72) Inventors: Yumi Fukuda, Setagaya (JP); Keiko Albessard, Yokohama (JP); Yasushi Hattori, Kawasaki (JP); Seiichi Suenaga, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/445,277

(22) Filed: Feb. 28, 2017

(65) Prior Publication Data

US 2018/0040784 A1   Feb. 8, 2018

(30) Foreign Application Priority Data

Aug. 4, 2016   (JP) .................. 2016-153952

(51) Int. Cl.
*H01L 33/50* (2010.01)
*C09K 11/61* (2006.01)

(52) U.S. Cl.
CPC .......... *H01L 33/507* (2013.01); *C09K 11/616* (2013.01); *H01L 2933/0041* (2013.01)

(58) Field of Classification Search
CPC .................................... H01L 33/507

USPC ........................................... 257/89
See application file for complete search history.

(56) References Cited

U.S. PATENT DOCUMENTS

| 7,358,542 | B2 | 4/2008 | Radkov et al. |
| 8,704,440 | B2 * | 4/2014 | Zheng .......... H01L 33/504 |
| | | | 313/501 |
| 8,907,558 | B2 | 12/2014 | Hiramatsu et al. |
| 9,719,014 | B2 * | 8/2017 | Fiedler .......... H01L 33/502 |
| 2015/0329770 | A1 | 11/2015 | Kaneyoshi et al. |
| 2015/0380614 | A1 | 12/2015 | Hiramatsu et al. |
| 2016/0340577 | A1 | 11/2016 | Hiramatsu et al. |

FOREIGN PATENT DOCUMENTS

| JP | 2009-528429 | 8/2009 |
| JP | 2013-189588 | 9/2013 |
| JP | 2014-141684 | 8/2014 |
| JP | 2014-177511 | 9/2014 |

(Continued)

*Primary Examiner* — Chandra Chaudhari
(74) *Attorney, Agent, or Firm* — Oblon, McClelland, Maier & Neustadt, L.L.P.

(57) ABSTRACT

The embodiment of the present disclosure provides a phosphor improved in the emission intensity maintenance ratio without impairing the emission intensity. The phosphor is a silicofluoride phosphor and shows an IR absorption spectrum satisfying the conditions of $0 \leq I_2/I_1 \leq 0.01$ and $6.7 \leq (I_3/I_1)/C_{Mn}$. In those conditional formulas, $I_1$, $I_2$ and $I_3$ are intensities of the maximum peaks in the ranges of 1200 to 1240 $cm^{-1}$, 3570 to 3610 $cm^{-1}$ and 635 to 655 $cm^{-1}$, respectively, and $C_{Mn}$ is a weight percent of Mn contained the phosphor.

11 Claims, 5 Drawing Sheets

(56) References Cited

FOREIGN PATENT DOCUMENTS

| JP | 2015-113362 | 6/2015 |
| JP | 2017-197691 | 11/2017 |
| JP | 2017-210580 | 11/2017 |
| JP | 2018-2813 | 1/2018 |

* cited by examiner

US 9,929,321 B2

PHOSPHOR, PRODUCING METHOD THEREOF AND LIGHT-EMITTING DEVICE EMPLOYING THE PHOSPHOR

CROSS-REFERENCE TO RELATED APPLICATIONS

This application is based upon and claims the benefit of priority from the prior Japanese Patent Application No. 2016-153952, filed on Aug. 4, 2016, the entire contents of which are incorporated herein by reference.

FIELD

Embodiments of the present disclosure relate to a phosphor, a producing method thereof and a light-emitting device employing the phosphor.

BACKGROUND

A light-emitting diode (LED) light-emitting device mainly comprises a combination of a phosphor and a LED chip serving as an excitation light source, and can realize various colors of emission light according to the combination.

Specifically, a white LED light-emitting device, which radiates white emission light, comprises a phosphor in combination with a LED chip that emits light in the blue region. For example, the device comprises a phosphor mixture and a LED chip giving off blue light. In practice, a phosphor emitting yellow light, which is complementary to blue light, is often adopted as the phosphor to produce a pseudo-white LED light-emitting device. Further, a three-wavelength white LED device is also developed which comprises a LED chip emitting blue light, a green- or yellow-light emitting phosphor and a red-light emitting phosphor. As an example of the red-light emitting phosphor used in that light-emitting device, $K_2SiF_6$:Mn phosphor is known.

Meanwhile, when conventional fluoride phosphors are continuously excited to emit luminescence, the emission intensity generally tends to go down from the initial intensity in course of time. However, if the phosphors are intended to be used in light-emitting devices, the emission intensity preferably changes little. In other words, the emission intensity maintenance ratio is preferred to be high. It is hence required to improve the emission intensity maintenance ratio. For the purpose of meeting that requirement, it is reported that the phosphors are surface-treated with a solution containing a surface-treatment agent, such as, organic amine or ammonium salt, so as to improve durability thereof under conditions of high temperature and high humidity. However, in order that the phosphors can be subjected to the above treatment after they are synthesized, the step of the treatment must be additionally carried out after the synthesizing process of the phosphors. Accordingly, in view of the production cost, it is desired to develop another method. Further, if conventional fluoride phosphors are brought into contact with water, their emission intensity generally tends to deteriorate. It is therefore not preferred to surface-treat the phosphors with a water-containing solution like the above treatment solution after they are synthesized.

DETAILED DESCRIPTION

Figure 1:
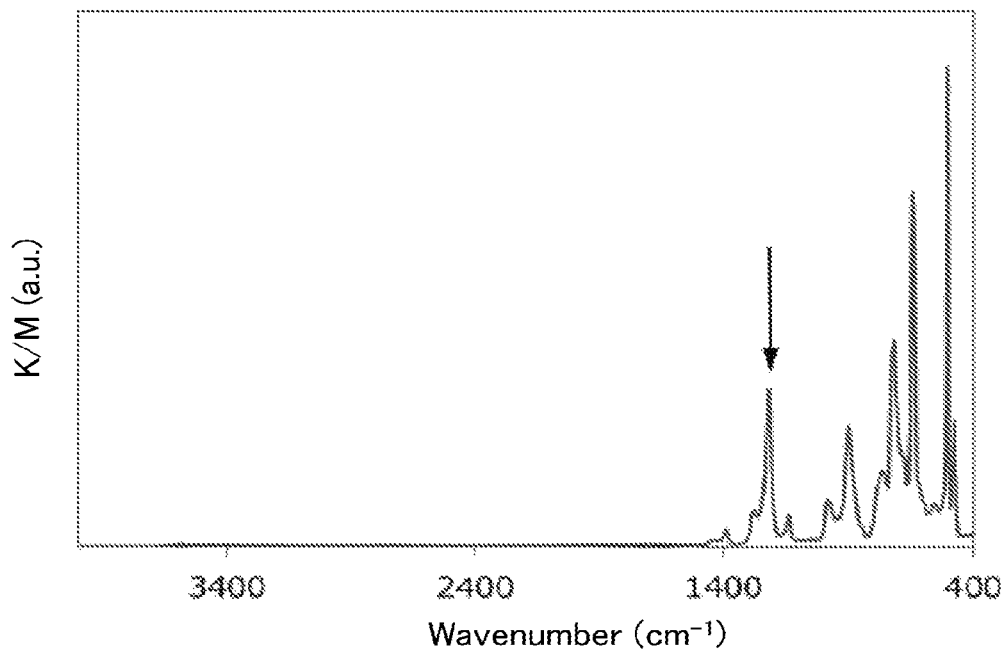
FIG. 1 shows an IR absorption spectrum of the phosphor (neat) according to an embodiment.

Embodiments will now be explained with reference to the accompanying drawings.

The phosphor according to an embodiment of the present disclosure is represented by the following formula (1):

$$(K_{1-p/k}M_{p/k})_a(Si_{1-x-y}Ti_xMn_y)F_b \quad (1)$$

in which M is at least one selected from the group consisting of Na and Ca; k represents the valence number of M and is an integer of 1 or 2; and a, b, p/k, x and y are numbers satisfying the conditions of
 1.5≤a≤2.5,
 5.0≤b≤6.5,
 0≤p/k≤0.1,
 0≤x≤0.3, and
 0<y≤0.2, respectively;
said phosphor shows an IR absorption spectrum satisfying the conditions of
 0≤I$_2$/I$_1$≤0.01 and
 6.7≤(I$_3$/I$_1$)/C$_{Mn}$
in which I$_1$ is an intensity of the maximum peak in the range of 1200 to 1240 cm$^{-1}$, I$_2$ is an intensity of the maximum peak in the range of 3570 to 3610 cm$^{-1}$, I$_3$ is an intensity of the maximum peak in the range of 635 to 655 cm$^{-1}$, and C$_{Mn}$ is a weight percent of Mn contained therein.

Further, the light-emitting device according to another embodiment of the present disclosure comprises:
 a light-emitting element radiating light with a peak in the wavelength range of 440 to 470 nm inclusive; and
 a phosphor layer contains the above phosphor.

Furthermore, the method for producing the phosphor according to still another embodiment of the present disclosure comprises the steps of
 (A) synthesizing a basic phosphor represented by the formula (1), and
 (B) subjecting the basic phosphor synthesized in the above step (A) to dehydration treatment at a temperature of 400 to 800° C. inclusive.

Embodiments of the present disclosure will now be explained below in detail. However, it is noted that the embodiments described below are provided only to illustrate phosphors or light-emitting devices embodying the technical concept of the present disclosure, and hence the present disclosure is by no means limited to the following examples.

The applicant has intensively researched and studied phosphors mainly comprising potassium silicofluoride activated by manganese, and finally found that the luminous efficiency and the emission intensity maintenance ratio are correlated with the coordinate structure of particular ions and also with ratios among particular peak intensities in the IR absorption spectrum (hereinafter, often referred to as "IR spectrum") of the phosphor.

In the embodiment, the phosphor is preferably represented by the following formula (1):

$$(K_{1-p/k}M_{p/k})_a(Si_{1-x-y}Ti_xMn_y)F_b \qquad (1).$$

In the formula, M is at least one selected from the group consisting of Na and Ca; k represents the valence number of M and is an integer of 1 or 2; and a, b, p/k, x and y are numbers satisfying the conditions of 1.5≤a≤2.5,
5.0≤b≤6.5,
0≤p/k≤0.1,
0≤x≤0.3, and
0<y≤0.2, respectively.

The phosphor of the embodiment contains manganese as an activator. The manganese preferably has a valence of +4 so that the phosphor can serve as a red-light emitting phosphor. The phosphor may contain manganese ions of other valences, but the amount thereof is preferably small and it is particularly preferred for all the manganese ions to have a valence of +4.

If not containing manganese (namely, in the case of y=0), the phosphor cannot be observed to emit luminescence even when excited by light having an emission peak in the blue to UV region. Accordingly, y in the formula (1) must be larger than 0. Further, y is preferably 0.005 or more because the luminous efficiency tends to be improved according as the manganese content increases.

On the other hand, however, if the manganese content is too high, the emission intensity of the phosphor tends to be lowered because of concentration quenching. The manganese content (y) is hence preferably 0.2 or less, more preferably 0.1 or less to avoid the quenching.

As described above, the phosphor according to the embodiment may contain elements other than the main constituting elements, such as, K, Si, F and Mn. For example, small amounts of Na, Ca and Ti may be contained. Even if containing those elements in small amounts, the phosphor shows such a similar emission spectrum in the red wavelength range as can achieve the aimed effect. However, in view of the stability of the phosphor and the cost for synthesizing the reactive phosphor, those elements are contained preferably only in small amounts. Further, the phosphor may contain elements other than those described here as inevitable ingredients. Even if so, the effect of the embodiment can be satisfyingly obtained.

The phosphor of the embodiment may contain other phases and impurities, as well as, the main phase. In that case, not only the whole composition of the phosphor but also the composition of the main phase preferably satisfies the above formula (1).

The content of each element in the phosphor can be analyzed, for example, in the following manner. For analyzing the metal elements such as K, Na, Ca, Si, Ti and Mn, the synthesized phosphor is subjected to alkali fusion and then analyzed according to ICP emission spectroscopy by means of, for example, IRIS Advantage ICP spectrometer ([trademark], manufactured by Thermo Fisher Scientific Inc.). For analyzing the non-metal element F, the synthesized phosphor is subjected to thermal hydrolysis and then analyzed by means of, for example, DX-120 ion chromatograph system ([trademark], manufactured by Nippon Dionex K.K.). However, the element F can be analyzed by ion chromatography after the alkali fusion procedure is carried out in the same manner as the above metal elements.

Although stoichiometrically containing no oxygen, the phosphor according to the embodiment is often inevitably contaminated with oxygen by decomposition of the surface during or after the synthesizing process thereof. The oxygen content in the phosphor is ideally equal to zero, but in practice preferably satisfies the condition of:

[oxygen content]/[(fluorine content)+(oxygen content)]<0.05 because the luminous efficiency is not seriously lowered under that condition.

Manganese-activated fluoride phosphors having basic structures comprising potassium, silicon and fluorine have been conventionally employed in light-emitting devices. When those light-emitting devices work continuously, the emission intensity of the phosphors generally deteriorates in course of time to lead a shift in the emission color. In order to solve this problem, various methods have been studied. However, there is room for improvement in any of them. The applicant has studied this problem, and finally found that among the above phosphors, a phosphor showing a particular IR spectrum has excellent properties. Specifically, the phosphor has an excellent emission intensity maintenance ratio if showing an IR spectrum in which the ratio of the maximum peak intensity (hereinafter, often referred to as $I_2$) in the range of 3570 to 3610 cm$^{-1}$ to that (hereinafter, often referred to as $I_1$) in the range of 1200 to 1240 cm$^{-1}$, namely, the relative intensity $I_{OH}$ (=$I_2/I_1$) is 0.01 or less.

The above relative intensity $I_{OH}$ is preferably 0.005 or less, further preferably 0.002 or less. Particularly preferably, there is no peak in the range of 3570 to 3610 cm$^{-1}$, which means $I_2=I_{OH}=0$.

The above IR spectrum intensity ratio is considered to depend on the amounts of some kinds of OH groups in the phosphor. Specifically, as described later, the peaks in 3570 to 3610 cm$^{-1}$ and at around 3200 cm$^{-1}$ are presumed to correspond to the OH bond characteristic vibration in lone OH groups and to that in water molecules contained near the phosphor, respectively. Accordingly, if showing an IR spectrum in which the above intensity ratio is within the particular range, the phosphor is presumed to contain OH bonds only in a small amount. In that case, the phosphor is considered to exhibit excellent properties.

Further, the phosphor is also required to have excellent luminous properties, such as, a high internal quantum efficiency. The applicant has studied and found that the internal quantum efficiency is correlated with the maximum peak intensity (hereinafter, often referred to as $I_3$) in the range of 635 to 655 cm$^{-1}$ in the IR spectrum. The intensity $I_3$ is presumed to correspond to (MnF$_6$)$^{2-}$ structures in the phosphor. Ideally, all Mn atoms in the phosphor have the (MnF$_6$)$^{2-}$ structures, but actually F atoms in the structures are often missing or replaced with other elements. If the structures have those defects, the internal quantum efficiency deteriorates. Accordingly, the higher the internal quantum efficiency is, the larger the intensity $I_3$ tends to be. However, it is evident that the intensity $I_3$ also depends on the content of Mn atoms in the phosphor, and hence a large value of $I_3$ does not directly mean a high internal quantum efficiency. The intensity $I_3$, therefore, should be evaluated in terms of value normalized by the Mn content in the phosphor. In order that the weight percent of Mn contained in the phosphor (hereinafter often represented by "$C_{Mn}$") can be taken account of, the ratio of $I_3$ to $I_1$ is divided by $C_{Mn}$ to normalize in the embodiment. Specifically, the applicant has found that, when the relative intensity $I_{Mn}$ [=$(I_3/I_1)/C_{Mn}$] thus obtained is 6.7 or more, both a high emission intensity maintenance ratio and a high internal quantum efficiency can be realized. The relative intensity $I_{Mn}$ is preferably 6.8 or more, further preferably 7 or more.

The method for measuring the IR spectrum is not particularly restricted. For example, the IR spectrum can be measured with an IR spectrophotometer, such as, Fourie transfer IR spectrophotometer FT/IR-6100 ([trademark], manufactured by JEOL Ltd.). The measurement conditions are, for example, as follows:

wavenumber resolution: 4 $cm^{-1}$,
sample scanning times: 100 times,
measuring wavenumber range: 400 to 4000 $cm^{-1}$, and
measurement atmosphere: ambient atmosphere.

It is preferred to use a TGS (DTGS) detector, which has high response linearity, so that the measurement can be carried out in a wide wavenumber range.

There are some methods, such as, transmission method, reflection method and ATR method, to measure IR spectra. The phosphor according to the embodiment is generally in the form of powder consisting of a few to 60 μm-size particles, and hence the IR spectrum thereof is preferably measured by the diffusion reflection method, in which the sample can be easily prepared and measured. When measured by the diffusion reflection method, the sample is generally diluted with a diluent, such as KBr or KCl, to a proper concentration (about 1 to 10%). However, the phosphor of the embodiment shows an IR spectrum having weak peak intensities at around 3590 $cm^{-1}$ and 3220 $cm^{-1}$, and those peak intensities are very likely to be affected by water contained in the diluent. Accordingly, it is preferred to carry out the measurement without the diluent. On the other hand, however, the peak intensity at around 645 $cm^{-1}$ is relatively large. Because of that, when that peak intensity is measured, the sample is preferably diluted with KBr or KCl, which is transparent in the IR region, to a proper concentration (about 1 to 10%) with the aim of accurate measurement. The concentration is so controlled with the diluent that the maximum spectrum intensity may not be more than 1.0 in the range of 400 to 4000 $cm^{-1}$. In the measurement of any sample, the background is preferably measured by use of the diluent.

Also in the measurement of any sample, the spectrum intensity is subjected to Kubelka-Munk conversion (hereinafter, often referred to as "KM conversion") so that the intensity ratios can be quantitatively treated.

FIGS. 1 to 4 show examples of IR spectra (after KM converted) given by the phosphor of the embodiment.

Figure 2:
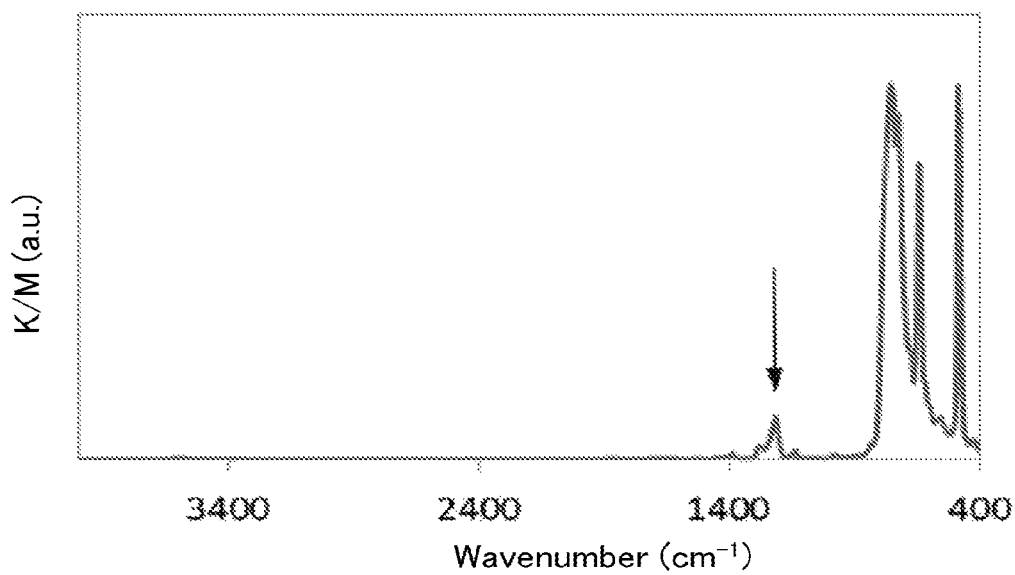
FIG. 2 shows an IR absorption spectrum of the phosphor (diluted) according to an embodiment.
Figure 3:
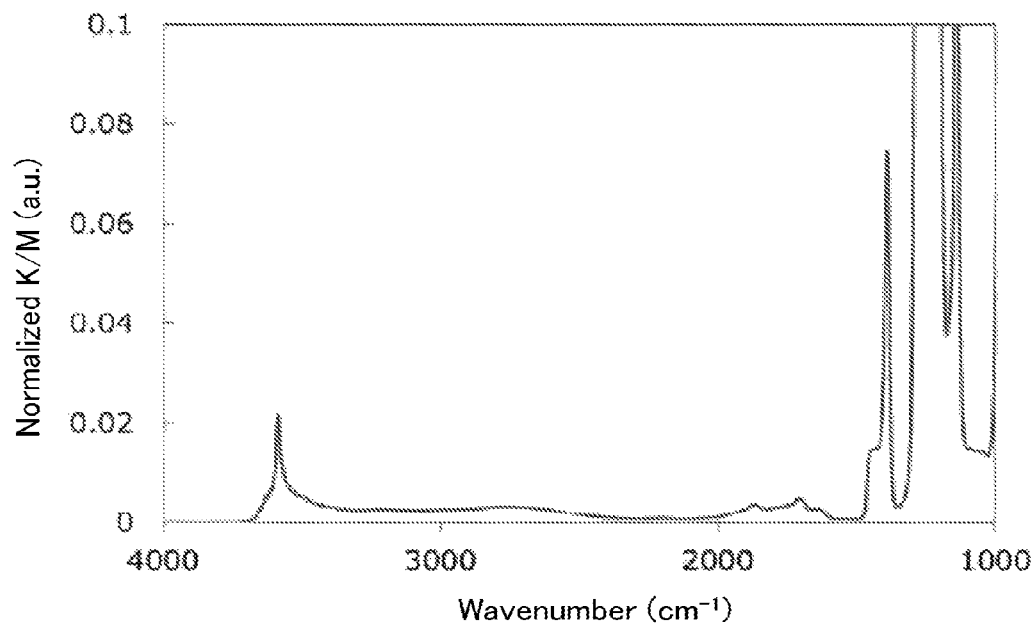
FIG. 3 shows an enlarged IR absorption spectrum (1000 to 4000 cm$^{-1}$) of the phosphor (neat) according to an embodiment.

FIG. 1 shows an IR spectrum (neat) given by the phosphor alone according to the embodiment, and FIG. 2 is an IR spectrum (diluted) of that diluted with a diluent. In FIGS. 1 and 2, the arrowed peak in 800 to 1600 $cm^{-1}$ is presumed to correspond to a normal mode of $K_2SiF_6$ matrix crystal. FIG. 3 shows an enlarged IR spectrum (neat) in 1000 to 4000 $cm^{-1}$ given by the phosphor alone. The peak in 3570 to 3610 $cm^{-1}$ is considered to correspond to the bond between Mn and OH group coordinating thereto. Further, the spectrum has a broad vibration peak in 2500 to 3500 $cm^{-1}$. This broad vibration peak can be assigned to OH bonds in water molecules adsorbed onto or combined with the phosphor crystal by hydrogen bond or coordination bond. The shown spectrum has those peaks in such relatively large intensities as to show them clearly, but the phosphor of the embodiment exhibits them in relatively small intensities (as described later).

Figure 4:
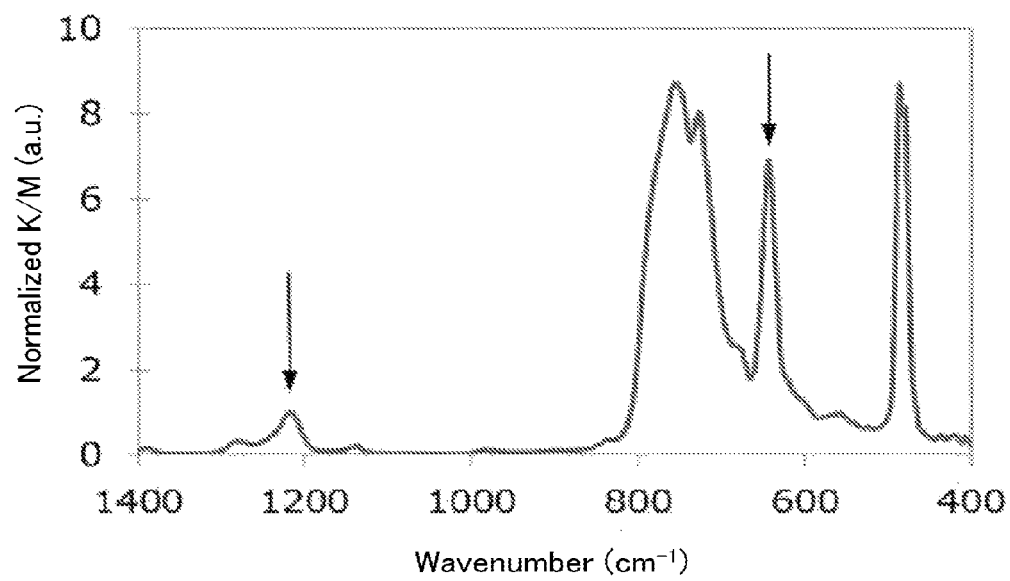
FIG. 4 shows an enlarged IR absorption spectrum (400 to 1400 cm$^{-1}$) of the phosphor (diluted) according to an embodiment.

The IR spectrum of FIG. 2 is enlarged in 400 to 1400 $cm^{-1}$ to obtain FIG. 4. The left-arrowed peak in 800 to 1600 $cm^{-1}$ in FIG. 4 is presumed to correspond to a normal mode of $K_2SiF_6$ matrix crystal, and the right-arrowed peak in 635 to 655 $cm^{-1}$ is considered to correspond to $(MnF_6)^{2-}$ ion, in which six fluorine ions coordinates to Mn. The phosphor of the embodiment exhibits this peak in a relatively large intensity (as described later).

The present embodiment is achieved on the basis of finding that the properties of the phosphor are correlated with the sharp maximum peak intensity ($I_2$) in 3570 to 3610 $cm^{-1}$ and the maximum peak intensity ($I_3$) in 635 to 655 $cm^{-1}$.

However, IR measurement is generally used for the purpose of qualitative evaluation, and hence it is difficult to quantitatively evaluate particular peak intensities. Accordingly, it is also difficult to demonstrate the correlation between the phosphor properties and $I_2$ or $I_3$. In view of that, the maximum peak intensity in 1200 to 1240 $cm^{-1}$, which is presumed to be attributed to a normal mode of $K_2SiF_6$ crystal, is adopted as a reference, and the relative peak intensities in 3570 to 3610 $cm^{-1}$ and 635 to 655 $cm^{-1}$ ($I_{OH}$ and $I_{Mn}$, respectively) in comparison with the reference are employed as indexes in the present embodiment.

The positions (wavenumbers) of the maximum peaks in the IR spectrum are often shifted according to the composition of the phosphor or the synthesizing condition thereof. For example, the peak position around 1220 $cm^{-1}$, which is an essential factor of the present embodiment, may be shifted within ±15 $cm^{-1}$ under preferred conditions or within ±5 $cm^{-1}$ under more preferred conditions.

The value $C_{Mn}$, which is necessary for calculating $I_{Mn}$, is the weight percent of Mn contained in the phosphor. The weight percent of Mn can be measured by any method. For example, it can be easily measured by atomic absorption spectrometry. Examples of the atomic absorption spectrometer usable in the embodiment include: AA7000 series ([trademark], manufactured by Shimadzu Corporation) and polarized Zeeman atomic absorption spectrometer (ZA3000 series [trademark], manufactured by Hitachi High-Technologies Corporation).

The phosphor according to the present embodiment is found to have both a high emission intensity maintenance ratio and a high internal quantum efficiency when used in a light-emitting device. The reason why the phosphor of the embodiment has those excellent properties is considered to be as follows. If a generally used phosphor having a fluoride matrix is incorporated in a light-emitting device, the phosphor is heated and consequently undergoes hydrolysis while the device keeps working. That is presumed to be the reason of emission intensity deterioration. From this presumption, it may be thought that the phosphor preferably contains lone OH groups only in a small amount and hence preferably shows a weak $I_{OH}$. However, if the phosphor is simply dehydrated to decrease the lone OH groups, defects may be formed in the phosphor crystal structure to decrease the intensity $I_{Mn}$ and hence to lower the internal quantum efficiency. That is why conventional phosphors cannot realize both satisfying $I_{OH}$ and $I_{Mn}$ at the same time whether they are simply dehydrated or not. In contrast, the phosphor of the embodiment realizes both a low $I_{OH}$ and a high $I_{Mn}$, and hence is presumed to be excellent in both emission intensity maintenance ratio and internal quantum efficiency.

The phosphor of the embodiment can be produced in any manner. For example, it can be obtained by a method comprising the steps of (A) synthesizing a basic phosphor represented by the formula (1), and (B) subjecting the basic phosphor synthesized in the above step (A) to dehydration treatment at a temperature of 400 to 800° C. inclusive.

The step (A) can be carried out according to a process generally adopted for producing potassium silicofluoride. Specifically, the basic phosphor represented by the formula (1) can be synthesized in a manner where (i) a Si-containing material and a Ti-containing material are mixed with potassium permanganate and/or sodium permanganate and then made to react in a hydrofluoric acid aqueous solution; or (ii) a potassium-containing material and/or a sodium-containing material are added into a hydrofluoric acid aqueous solution in which a mixture of hexafluorosilicic acid ($H_2SiF_6$) with potassium hexafluoromanganate ($K_2MnF_6$) or with sodium hexafluoromanganate is beforehand dissolved, so that they are made to react to synthesize and obtain the basic phosphor by a co-precipitation method or a poor solvent precipitation method.

Further, it is also possible to synthesize the basic phosphor in another way in which a potassium-containing material is added and made to react in a solution containing hexafluorosilicic acid, potassium hexafluoromanganate ($K_2MnF_6$) and the like dissolved therein so that the basic phosphor can be obtained by a poor solvent precipitation method. In any production method, the basic phosphor can be obtained by a process in which the synthesis is carried out in a hydrofluoric acid-containing aqueous solution and thereafter the product is subjected to dry treatment such as suction filtration.

The applicant has studied and found that, even after subjected to the dry treatment such as suction filtration or the like, the phosphor inevitably contains lone OH groups or water adsorbed on the phosphor surface. Although the synthesis method and synthesis parameters can be selected optimally enough to reduce the content of lone OH groups and water contained in the phosphor to a certain degree, it is not easy to sufficiently remove the OH groups and water only by controlling the synthesis process. Because of that, after the basic phosphor is synthesized and, if necessary, subjected to the dry treatment in the above manner, the dehydration treatment (the step (B)) is carried out so that the OH groups and water can be removed. The dehydration treatment is carried out at a temperature of preferably 400 to 800° C. inclusive, more preferably 500 to 750° C. inclusive under a pressure of preferably 0.0003 to 8 atmospheres inclusive, more preferably 0.01 to 6 atmospheres inclusive for a treatment time of preferably 1 minute to 24 hours inclusive, more preferably 5 minutes to 10 hours inclusive. The treatment under those conditions makes it possible to remove the lone OH groups and water not only on the phosphor surface but also inside the phosphor particles. The dehydration treatment is preferably carried out in an atmosphere not impairing the phosphor structure. Specifically, since the phosphor has a composition represented by the formula (1), the dehydration atmosphere preferably does not contain ingredients changing the composition. Examples of the generally usable atmosphere include inert gases, such as, nitrogen, argon, and helium. Further, in order to prevent the phosphor composition from changing or to compensate structural defects of the phosphor, the dehydration treatment can be carried out in a fluorine-containing inert gas atmosphere. It is particularly preferred to carry out the treatment in such a fluorine-containing inert gas atmosphere as can provide fluorines to compensate vacant positions where the OH groups and the like are removed from the phosphor crystal in the dehydration treatment. Here, the "fluorines" means fluorine atoms or ions, and the "fluorine-containing inert gas" means an inert gas containing a fluorine compound. The fluorine compound preferably has a boiling or sublimation point of 50 to 800° C. inclusive at the atmospheric pressure.

If the dehydration treatment is carried out under drastic conditions with the aim of removing the lone OH groups and water, the phosphor may be partly impaired or oxidized. Accordingly, in order to avoid the impairment or oxidization in conventional processes, the phosphor synthesized in an aqueous solution is generally not intensively dehydrated by heating or by reducing the pressure although they may be dried in air at room temperature. In the present embodiment, however, the conditions, such as, temperature, pressure and atmosphere, in the step for dehydrating the synthesized phosphor are so controlled that it becomes possible to avoid the impairment or oxidization of the phosphor.

The absorptivity and internal quantum efficiency $\eta'$ of the phosphor are calculated according to the following formulas:

$$\text{absorptivity}(\alpha) = \frac{\int \lambda \cdot [E(\lambda) - R(\lambda)] d\lambda}{\int \lambda \cdot [E(\lambda)] d\lambda}$$

$$\text{internal quantum efficiency}(\eta') = \frac{\int \lambda \cdot [P(\lambda)] d\lambda}{\int \lambda \cdot [E(\lambda) - R(\lambda)] d\lambda}$$

In the formulas, $E(\lambda)$: the whole spectrum of light emitted by the excitation light source onto the phosphor (in terms of the number of photons), $R(\lambda)$: the spectrum of light emitted by the excitation light source but reflected by the phosphor (in terms of the number of photons), and $P(\lambda)$: the emission spectrum of the phosphor (in terms of the number of photons).

The absorptivity and internal quantum efficiency of the phosphor can be measured, for example, by means of C9920-02G absolute PL quantum yields measurement system ([trademark], manufactured by Hamamatsu Photonics K.K.). The above matrix coloring can be measured by use of excitation light having a peak wavelength at about 650 nm with a half-width of 5 to 10 nm. On the other hand, for measuring the internal quantum efficiency, blue light having a peak wavelength in about 440 to 470 nm with a half-width of 5 to 15 nm can be adopted as the excitation light.

Figure 5:
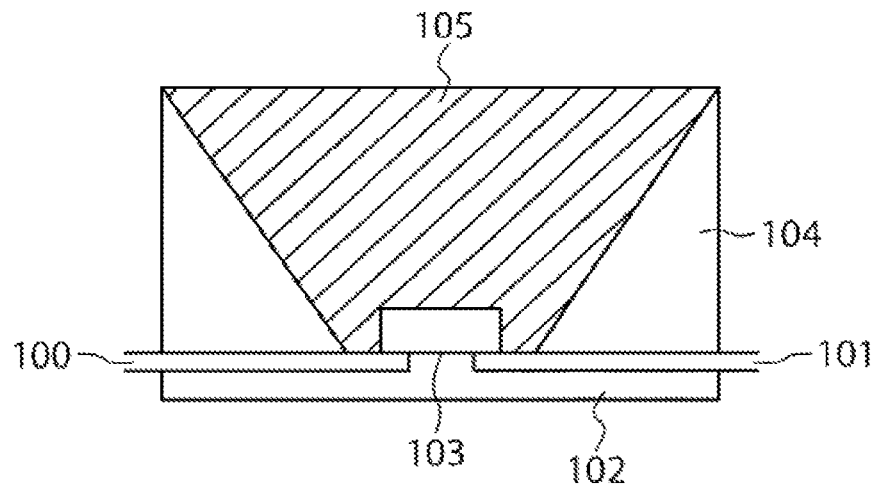
FIG. 5 shows a schematic sectional view of the light-emitting device according to an embodiment.

When used in a light-emitting device or the like, the phosphor of the embodiment preferably has an internal quantum efficiency of 80% or more. FIG. 5 shows that the internal quantum efficiency increases according as $I_{Mn}$ increases. In order to obtain an internal quantum efficiency of 80% or more, $I_{Mn}$ is preferably 6.7 or more, further preferably 6.8 or more. FIG. 5 indicates that the larger $I_{Mn}$ the phosphor of the formula (1) exhibits, the higher internal quantum efficiency it has. Accordingly, $I_{Mn}$ is preferably a large value. There are many ways to realize a large $I_{Mn}$. As one of them, it is preferred to optimize the dehydration conditions.

The phosphor particles of the embodiment may be classified with a sieve according to the coating method adopted for producing the light-emitting device. For producing a common white LED device, which adopts excitation light having an emission peak in the blue region, it is generally preferred to use the phosphor particles sieved to have a mean particle size of 1 to 50 µm. If the phosphor particles are sieved to be too small, the emission intensity may be lowered. On the other hand, if sieved to be too large, they may clog a nozzle of coating machine when the phosphor layer is formed in the LED device, and consequently the operational efficiency and production yield may be lowered and/or the resultant light-emitting device may exhibit light of uneven color.

The phosphor of the embodiment can be excited by an excitation light source showing an emission peak in the blue to UV region. When the phosphor is used in the light-emitting device, the excitation light source is preferably a light-emitting element having an emission peak in the wavelength range of 440 to 470 nm inclusive. In view of the luminous efficiency, it is not preferred to use light-emitting elements having emission peaks out of the above range. Examples of the light-emitting element include solid-state light source elements such as LED chips and laser diodes.

The phosphor of the embodiment emits red luminescence, and therefore can be combined with green- and yellow-light emitting phosphors to obtain a white light-emitting device if the excitation light is blue in color. If the excitation light is UV light, it can be combined with blue-, green- and yellow-light emitting phosphors to obtain a white light-emitting device. What phosphors to use can be freely selected according to the purpose of the light-emitting device. For example, in the case of producing a white light-emitting device for illumination having a low color temperature, the phosphor of the embodiment is combined with a yellow-light emitting phosphor to obtain a device excellent in both efficiency and color rendering properties.

Green- and yellow-light emitting phosphors can be said to be phosphors having main emission peaks in the wavelength range of 520 to 570 nm inclusive. Examples of those phosphors include: silicate phosphors, such as, $(Sr,Ca,Ba)_2SiO_4$:Eu and $Ca_3(Sc,Mg)_2Si_3O_{12}$:Ce; aluminate phosphors, such as, $(Y,Gd)_3(Al,Ga)_5O_{12}$:Ce; sulfide phosphors, such as, $(Ca,Sr,Ba)Ga_2S_4$:Eu; and alkaline earth oxynitride phosphors, such as, $(Ca,Sr,Ba)Si_2O_2N_2$:Eu and Eu-activated (Ca, Sr)-αSiAlON, βSiAlON. Here, the "main emission peaks" means the wavelengths at which the phosphors exhibit the largest emission intensities in their emission spectra. The emission peaks of the exemplified phosphors have been already reported in various references and the like. The emission peaks are often shifted within about 10 nm by small amounts of additive elements used in producing the phosphors or by slight fluctuation of the composition, but even the phosphors showing those shifted emission peaks are also included in the above exemplified phosphors.

Blue-light emitting phosphors can be said to be phosphors having main emission peaks in the wavelength range of 440 to 500 nm inclusive. Examples thereof include: halophosphate phosphors, such as, $(Sr,Ca,Ba,Mg)_5(PO_4)_3(Cl,Br)$:Eu and $(Sr,Ca,Ba,Mg)_5(PO_4)_3Cl$:Eu; phosphate phosphors, such as, $2SrO.0.84P_2O_5.0.16B_2O_3$:Eu; and alkaline earth metal aluminate phosphors, such as, $BaMgAl_{10}O_{17}$: Eu.

According to the purpose, the light-emitting device employing the phosphor of the embodiment may further comprise orange- and/or red-light emitting phosphors other than the above.

Examples of the orange- and red-light emitting phosphors include: silicate phosphors, such as, $(Sr,Ca,Ba)_2SiO_4$:Eu; tungstate phosphors, such as, $Li(Eu,Sm)W_2O_8$; oxysulfide phosphors, such as, $(La,Gd,Y)_2O_2S$:Eu; sulfide phosphors, such as, $(Ca,Sr,Ba)S$:Eu; and nitride phosphors, such as, $(Sr,Ba,Ca)_2Si_5N_8$:Eu and $(Sr,Ca)AlSiN_3$:Eu. Those can be employed in combination with the phosphor of the embodiment so as to further improve not only the efficiency but also the color rendering properties for illumination use and the color gamut for backlight use. However, if too many phosphors are used, the light-emitting device may be impaired in the efficiency because of re-absorption phenomenon, in which one of the phosphors absorbs light emitted from another thereof, and/or because of scattering phenomenon, in which light emitted from one of the phosphors is scattered by others thereof.

FIG. 5 shows a schematic sectional view of a light-emitting device according to an embodiment of the present disclosure. The shown device comprises leads 100 and 101, a stem 102, a semiconductor light-emitting element 103, a reflective surface 104, and a phosphor layer 105. The light-emitting element 103 is mounted with Ag paste or the like at the center of the bottom, and radiates, for example, UV or visible emission. Examples of the light-emitting element 103 include GaAs type and GaN type semi-conductor light-emitting diodes. The positions of the leads 100 and 101 can be adequately modified. The phosphor layer 105 is placed in the concavity of the device. It can be formed by dispersing the phosphor of the embodiment in a resin layer made of, for example, silicone resin in an amount of 5 to 80 wt % inclusive.

The semiconductor light-emitting element 103 may be of a flip chip type in which the n- and p-electrodes are placed on the same plane. This element can avoid troubles concerning the wires, such as disconnection or dislocation of the wires and light-absorption by the wires. In that case, therefore, it is possible to obtain a semiconductor light-emitting device which has a high emission intensity maintenance ratio, which hardly suffers from color drift and which provides high brightness. Further, it is also possible to adopt a light-emitting element 103 having an n-type substrate so as to produce a light-emitting device constituted as described below. Specifically, in that device, an n-electrode is formed on the back surface of the n-type substrate while a p-electrode is formed on the top surface of a semiconductor layer laid on the substrate. The n- or p-electrode is mounted on one of the leads, and the p- or n-electrode is connected to the other lead by way of a wire, respectively. The size and kind of the light-emitting element 103 and the dimension and shape of the concavity can be properly changed.

Figure 6:
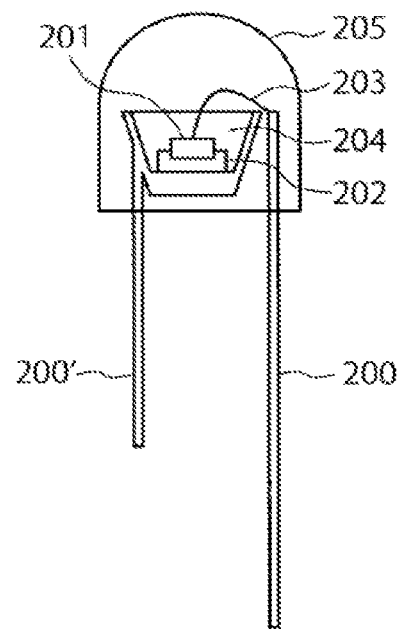
FIG. 6 shows a schematic sectional view of the light-emitting device according to another embodiment.
Figure 7:
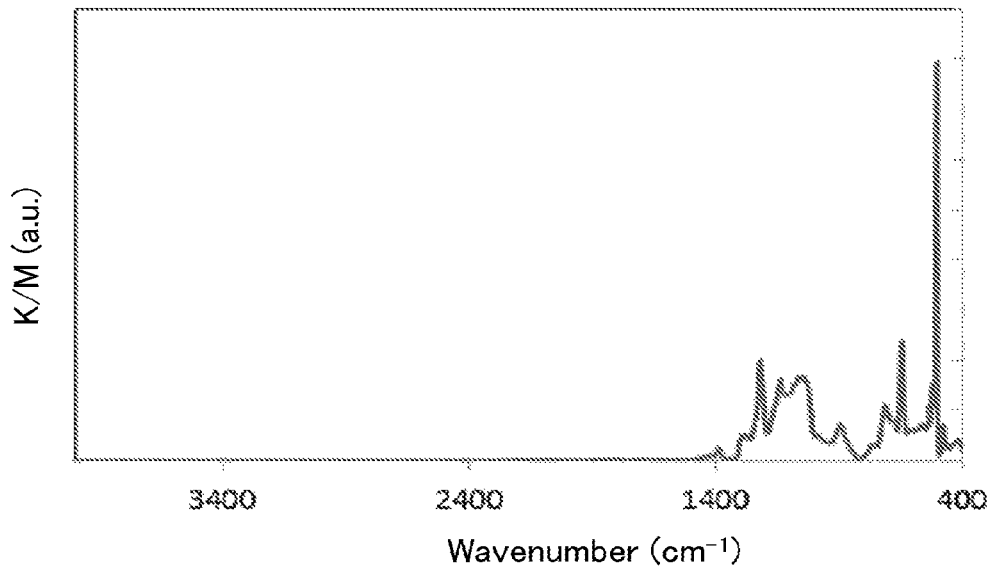
FIG. 7 shows an IR absorption spectrum of the phosphor (neat) in Example 1.
Figure 8:
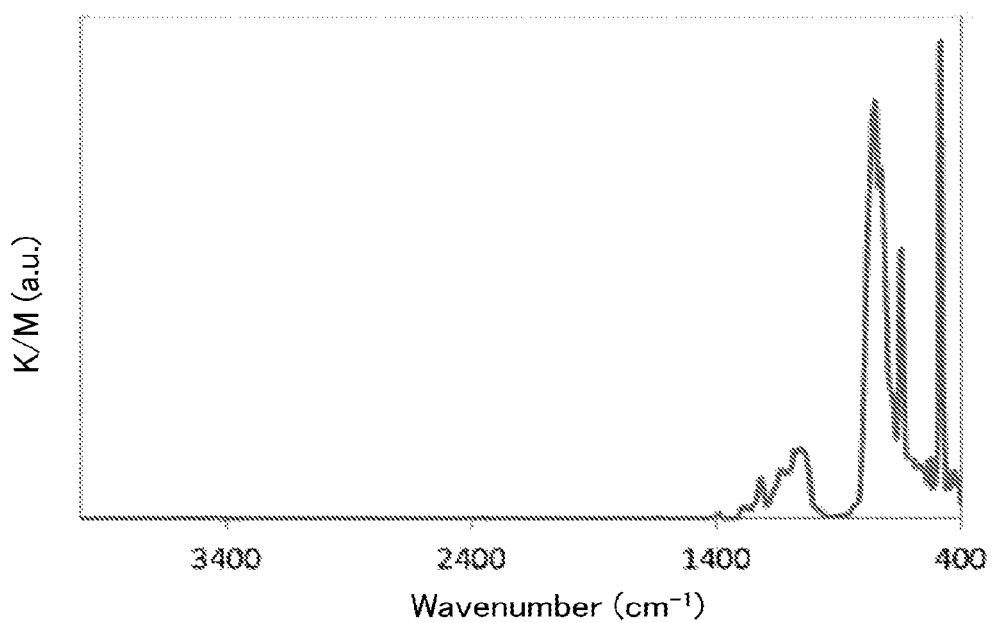
FIG. 8 shows an IR absorption spectrum of the phosphor (diluted) in Example 1.
Figure 9:
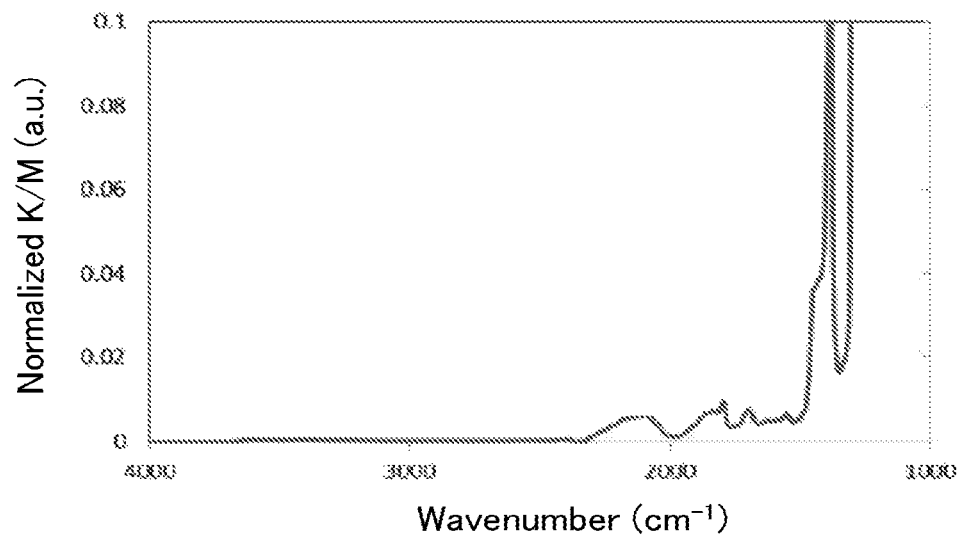
FIG. 9 shows an enlarged IR absorption spectrum (1000 to 4000 cm$^{-1}$) of the phosphor (neat) in Example 1.
Figure 10:
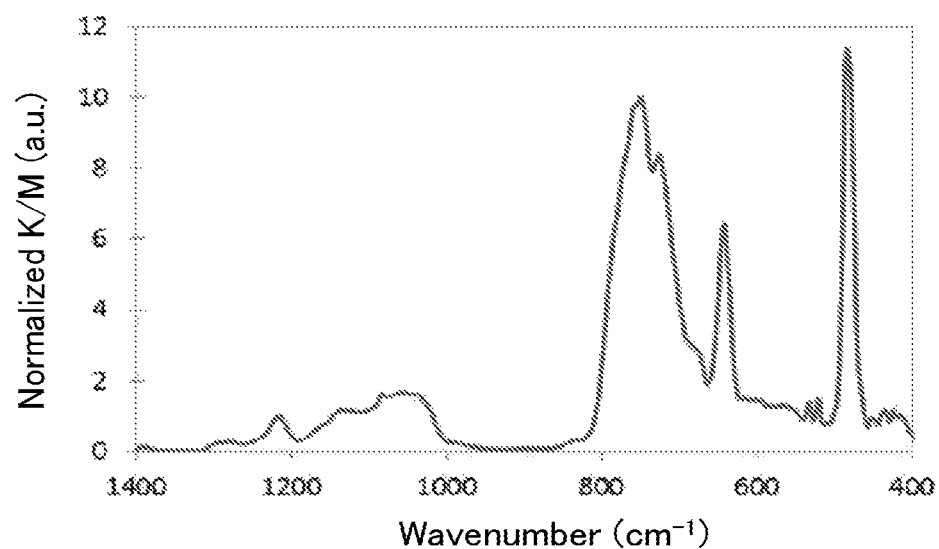
FIG. 10 shows an enlarged IR absorption spectrum (400 to 1400 cm$^{-1}$) of the phosphor (diluted) in Example 1.

FIG. 6 shows a schematic sectional view of a shell-type light-emitting device, in which a semiconductor light-emitting element 201 is mounted on a lead 200' with a mount member 202 and covered with a predip material 204. The light-emitting element 201 is connected to a lead 200 by way of a bonding wire 203, and is sealed with a casting material 205. The phosphor of the embodiment is contained in the predip material 204.

The light-emitting device, such as a white LED device, according the embodiment is suitably used for general illumination as described above, but is also favorably used in combination with color filters and the like to serve as a lighting element such as a light source for backlighting of liquid crystal displays. Specifically, it can be adopted as a liquid crystal display backlight light source or as a red-light emitting element employed in an inorganic electroluminescence device comprising a blue-light emitting layer.

The embodiments of the present disclosure will be further explained in detail by Examples and Comparative examples described below, but are by no means limited to the following Examples unless deviating from the scope and spirit of the disclosure.

EXAMPLES

Example 1 and Comparative Examples 1 and 2

Powdery KMnO$_4$ and powdery KF were dissolved in a HF aqueous solution, and then a H$_2$O$_2$ aqueous solution was gradually dropped therein and sufficiently made to react in the HF aqueous solution to synthesize K$_2$MnF$_6$, which was suction filtrated to obtain K$_2$MnF$_6$ powder. Independently, powdery SiO$_2$ was dissolved in another HF aqueous solution to prepare a H$_2$SiF$_6$ solution. Further, powdery KF was dissolved in still another HF aqueous solution to prepare a KF solution. The above K$_2$MnF$_6$ powder was then dissolved in the prepared H$_2$SiF$_6$ solution to obtain a reaction solution, to which the prepared KF solution was dropped and sufficiently made to react in the reaction solution to synthesize K$_2$SiF$_6$:Mn. Subsequently, the synthesized K$_2$SiF$_6$:Mn was suction filtrated to obtain powdery phosphor (Comparative example 1). The obtained phosphor was subjected to composition analysis, and found to be K$_{2.03}$(Si$_{0.98}$,Mn$_{0.02}$)F$_6$. Thereafter, the phosphor was subjected to dehydration treatment at 550° C. for 1 hour in a nitrogen-free atmosphere or in a nitrogen-containing atmosphere (Comparative example 2 or Example 1, respectively).

The IR spectra of the phosphors according to Example 1 and Comparative examples 1 and 2 were measured. Table 1 shows the relative intensities I$_{OH}$ and I$_{Mn}$, emission intensity maintenance ratio and internal quantum efficiency of each phosphor. FIGS. 7 to 10 show the IR spectra of Example 1. Among them, the IR spectra in FIGS. 7 and 9 were given by the phosphor of Example 1 alone (i.e., neat phosphor) while those in FIGS. 8 and 10 were given by that diluted with a diluent (i.e., diluted phosphor).

The IR spectrum measurement was carried out with a Fourie transfer IR spectrophotometer FT/IR-6100 ([trademark], manufactured by JEOL Ltd.), whose I$_{OH}$ detection limit is 0.001. Accordingly, if lower than the detection limit, the I$_{OH}$ value was regarded as 0.001 in Table 1.

Each phosphor of Example 1 and Comparative examples 1 and 2 was individually mixed with a resin, and then mounted on a GaN type LED light-emitting element and sealed to produce a light-emitting device. Subsequently, a current was supplied to the LED of each device and thereby the device was continuously worked. While the device was thus made to keep working, it was observed how the emission intensity thereof changed. Table 1 shows the emission intensity maintenance ratio after 500 or 1000 hours. The results indicate that the intensity deterioration of the emission is reduced in the device employing the phosphor of the embodiment even if the device keeps working.

TABLE 1

| | Com. 1 | Com. 2 | Ex. 1 |
|---|---|---|---|
| I$_{OH}$ | 0.020 | 0.001 | 0.001 |
| C$_{Mn}$ (wt. %) | 0.94 | 0.94 | 0.94 |
| I$_{Mn}$ | 7.3 | 6.5 | 6.8 |
| emission intensity maintenance ratio after 1000 hours | 0.76 | 0.99 | 0.99 |

TABLE 1-continued

| | Com. 1 | Com. 2 | Ex. 1 |
|---|---|---|---|
| internal quantum efficiency | 0.89 | 0.70 | 0.80 |

The above results tell that a phosphor showing a high I$_{OH}$ has a large internal quantum efficiency but exhibits too poor an emission intensity maintenance ratio to use practically. On the other hand, it is also indicated that a phosphor showing both an I$_{OH}$ of 0.01 or less and an I$_{Mn}$ of 6.7 or more has a high emission intensity maintenance ratio as well as a practically large enough internal quantum efficiency.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the invention.

DESCRIPTION OF THE NUMERALS

100, 101: lead, 102: stem,
103: semiconductor light-emitting element,
104: reflective surface, 105: phosphor layer,
200, 200': lead,
201: semiconductor light-emitting element,
202: mount member, 203: bonding wire,
204: predip material, 205: casting material

The invention claimed is:

1. A phosphor represented by the following formula (1):

$$(K_{1-p/k},M_{p/k})_a(Si_{1-x-y},Ti_x,Mn_y)F_b \qquad (1)$$

in which M is at least one selected from the group consisting of Na and Ca; k represents the valence number of M and is an integer of 1 or 2; and a, b, p/k, x and y are numbers satisfying the conditions of
1.5≤a≤2.5,
5.0≤b≤6.5,
0≤p/k≤0.1,
0≤x≤0.3, and
0<y≤0.2, respectively;
said phosphor shows an IR absorption spectrum satisfying the conditions of
0≤I$_2$/I$_1$≤0.01 and
6.7≤(I$_3$/I$_1$)/C$_{Mn}$
in which I$_1$ is an intensity of the maximum peak in the range of 1200 to 1240 cm$^{-1}$, I$_2$ is an intensity of the maximum peak in the range of 3570 to 3610 cm$^{-1}$, I$_3$ is an intensity of the maximum peak in the range of 635 to 655 cm$^{-1}$, and C$_{Mn}$ is a weight percent of Mn contained therein.

2. The phosphor according to claim 1, wherein said ratio of I$_2$/I$_1$ satisfies the condition of 0≤I$_2$/I$_1$≤0.005.

3. The phosphor according to claim 1, wherein said numbers p/k and x in the formula (1) satisfy the conditions of p/k=0 and x=0, respectively.

4. The phosphor according to claim 1, whose internal quantum efficiency η' is 80% or more.

5. A light-emitting device comprising:
a light-emitting element radiating light with a peak in the wavelength range of 440 to 470 nm inclusive; and
a phosphor layer which contains the phosphor according to claim 1.

6. The light-emitting device according to claim 5, wherein said phosphor layer further contains another phosphor exhibiting an emission peak in the wavelength range of 520 to 570 nm inclusive.

7. A method for producing the phosphor according to claim 1, comprising the steps of
(A) synthesizing a basic phosphor represented by the formula (1), and
(B) subjecting the basic phosphor synthesized in said step (A) to dehydration treatment at a temperature of 400 to 800° C. inclusive.

8. The method according to claim 7, wherein said step (A) is either
(i) a step in which a Si-containing material and a Ti-containing material are combined with potassium permanganate and/or sodium permanganate and then made to react in a hydrofluoric acid aqueous solution, to synthesize the basic phosphor; or
(ii) a step in which a potassium-containing material and/or a sodium-containing material are added into a hydrofluoric acid aqueous solution in which a mixture of hexafluorosilicic acid with potassium or sodium hexafluoromanganate is beforehand dissolved, so that they are made to react to synthesize and obtain the basic phosphor by a co-precipitation method or a poor solvent precipitation method.

9. The method according to claim 7, wherein said step (B) is carried out at a pressure of 0.0003 to 8 atmospheres inclusive.

10. The method according to claim 7, wherein said step (B) is carried out in an atmosphere of a fluorine-containing inert gas.

11. The method according to claim 10, wherein the atmosphere of said step (B) contains a fluorine compound having a boiling or sublimation point of 50 to 800° C. inclusive at the atmospheric pressure.

* * * * *